United States Patent [19]  [11] 4,042,947
Chu et al.  [45] Aug. 16, 1977

[54] HIGH VOLTAGE TRANSISTOR WITH HIGH GAIN

[75] Inventors: Chang K. Chu, Pittsburgh; Philip L. Hower, Churchill Boro; George W. Vomish, Ruffsdale, all of Pa.

[73] Assignee: Westinghouse Electric Corporation, Pittsburgh, Pa.

[21] Appl. No.: 646,794

[22] Filed: Jan. 6, 1976

[51] Int. Cl.$^2$ .......................... H01L 29/72
[52] U.S. Cl. ........................ 357/34; 357/56
[58] Field of Search ............ 357/89, 55, 34, 90, 357/38, 56

[56] References Cited

U.S. PATENT DOCUMENTS

| | | | |
|---|---|---|---|
| 3,418,226 | 12/1968 | Marinace | 357/90 |
| 3,579,060 | 3/1971 | Davis | 357/55 |
| 3,669,760 | 6/1972 | Rein et al. | 357/55 |
| 3,840,887 | 10/1974 | Roberts et al. | 357/91 |
| 3,872,494 | 3/1975 | Davis, Jr. et al. | 357/89 |
| 3,926,695 | 12/1975 | U | 357/55 |

Primary Examiner—Michael J. Lynch
Assistant Examiner—James W. Davie
Attorney, Agent, or Firm—C. L. Menzemer

[57] ABSTRACT

A transistor device is described in which an NPN semiconductor structure has a specially adapted N-type emitter zone and associated electrode. The emitter zone is produced by etching a cavity in one major surface of the semiconductor body followed by diffusion of N-type dopant material. Emitter, base and collector electrodes are then affixed to the appropriate surfaces of the body to provide electrical and thermal contact thereto.

1 Claim, 12 Drawing Figures

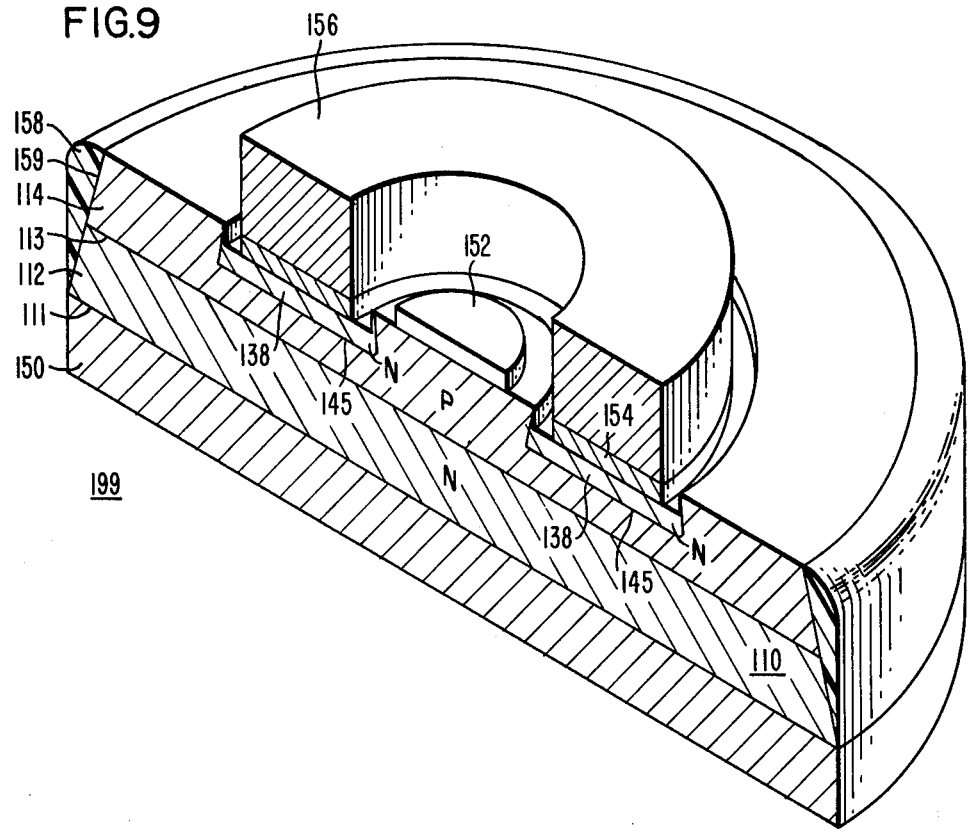
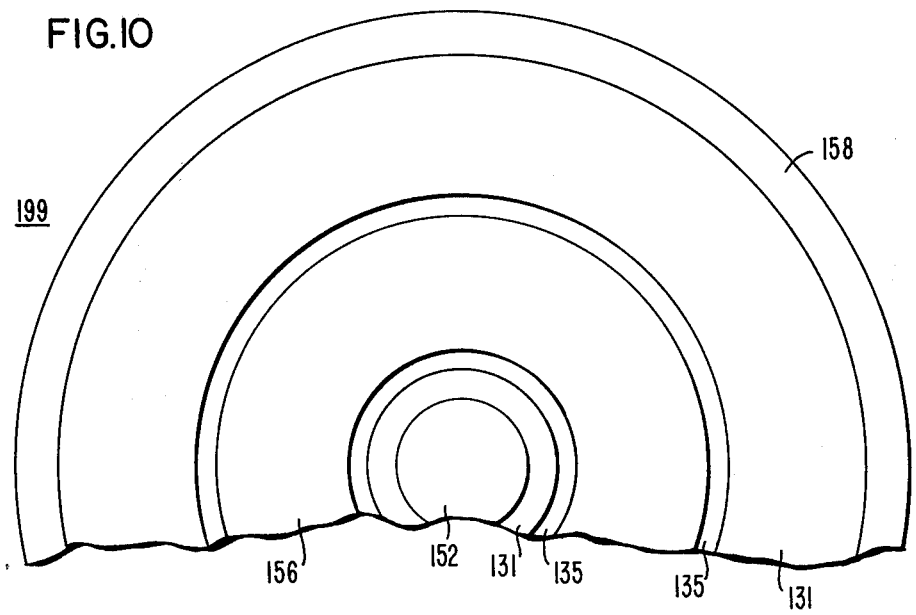

HIGH VOLTAGE TRANSISTOR WITH HIGH GAIN

BACKGROUND OF THE INVENTION

1. Field of the Invention:

The present invention relates to semiconductor switching devices and more particularly to silicon transistor devices.

2. Description of the Prior Art:

Transistor devices of the prior art have a general structural configuration shown in FIG. 1 wherein a body of semiconductor material in the form of a wafer 10 is doped to provide three alternate semiconductivity zones. Such a device is commonly referred to in the art as a single diffused device.

A collector zone 12 of N-type semiconductivity extends from one major surface 11 of the wafer 10 into the semiconductor material to meet a base zone 14 of P-type semiconductivity. PN junction 13 is formed at the interface of zones 12 and 14. Zone 14 extends from PN junction 13 to emitter zone 16 of N-type semiconductivity where PN junction 15 is formed. A cavity is etched in the center of the wafer 10 to a depth which penetrates PN junction 15 terminating in surface 17. Base electrode 18 is affixed to and makes good electrical contact with base zone 14 along a portion of recessed surface 17. An emitter electrode 20 is affixed to and makes good contact with emitter zone 16 at major surface 19. The electrodes 18 and 20 may be provided, for example, by aluminum deposition in a known manner. A supporting collector electrode 22 is affixed to major surface 11 to provide good electrical and thermal contact to collector zone 12 as well as to provide mechanical support for the wafer 10. Typical examples of metals used for the electrode 22 are molybdenum and tungsten, which are preferred for their favorable expansion properties. The wafer 10 has a beveled edge 23 produced in a known manner. Disposed on the beveled edge 23 is an insulating and protective coating 24. The coating composition and manner of application are known in the art, a high temperature curing silicone varnish being an example of a suitable coating material.

It has been found that prior art transistor device 99, shown in FIG. 1, has a limited collector-base blocking voltage capability. The present invention provides a transistor device which achieves a higher collector-base blocking voltage than prior art device 99 while at the same time improving high current gain.

SUMMARY OF THE INVENTION

The present invention is a transistor comprising a wafer of semiconductor material and contacting means for making thermal and electrical contact to said wafer;

Said wafer comprising a collector zone of a first type of semiconductivity disposed along a first major surface of said wafer, a base zone of a second type of semiconductivity disposed adjacent to said collector zone, a collector-base PN junction formed between said collector zone and said base zone, an emitter zone of said first type of semiconductivity disposed adjacent to said base zone, an emitter-base PN junction formed between said emitter zone and said base zone, portions of said base zone extending past said emitter zone to a second major surface of said wafer, said second major surface being parallel to said first major surface, a beveled edge surface joining the periphery of said first and said second major surfaces, said beveled edge surface forming an acute angle with said first major surface and forming an obtuse angle with said second major surface, said beveled edge surface being separated from said emitter zone by portions of said base zone, said collector-base PN junction being parallel to said major surfaces and terminating at said beveled edge surface, a recessed surface bordering said emitter zone and parallel to said major surfaces, aid recessed surface located at a predetermined depth in said wafer from said second major surface;

Said contacting means comprising a collector electrode affixed to said collector zone at said first major surface, a base electrode affixed to said base zone at said second major surface, a first emitter electorde affixed to said emitter zone at said recessed surface, and a second emitter electrode contacting said first emitter electrode and extending past said second major surface.

BRIEF DESCRIPTION OF THE DRAWINGS

FIG. 9 is a three-dimensional view of the embodiment of FIG. 8;

FIG. 10 is a plan view of the embodiment of FIG. 8;

DESCRIPTION OF THE PREFERRED EMBODIMENTS

Figure 2:
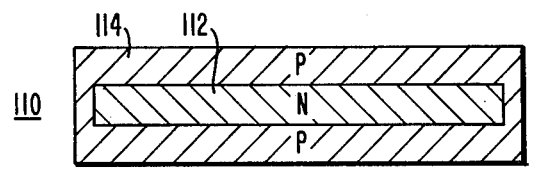

As illustrated by FIG. 2, a body of semiconductor material in the form of a wafer 110 is prepared with three layers of alternate semiconductivity type in a known manner. In a presently preferred embodiment, N-type silicon bar stock is sliced into wafers, each wafer then being subjected to a P-type diffusion to produce a PNP wafer structure. For example, boron, aluminum or gallium may be diffused into the wafer 110 to produce an outer zone 114 of P-type semiconductivity while inner zone 112 remains N-type semiconductivity.

Figure 3:
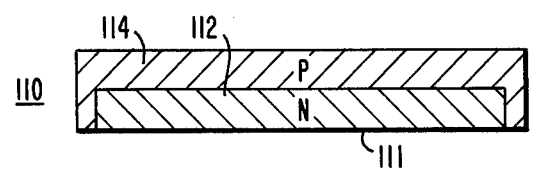

FIG. 3 shows the next step in manufacturing process wherein wafer 110 is lapped on one side to expose N-type zone 112 at major surface 111.

Figure 4:
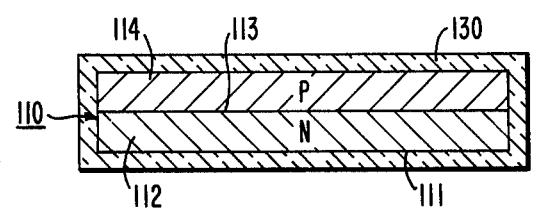

In FIG. 4, the wafer 110 is subjected to an oxidizing ambient to produce a silicon dioxide layer 130 on all exposed surfaces, the two-layered crystalline wafer 110 being contained therein. N-type zone 112 forms PN junction 113 at its interface with P-type zone 114.

Figure 5:
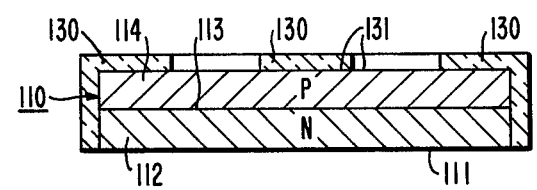

In FIG. 5 the structure is shown after the silicon dioxide layer 130 has been removed from major surface 11 and portions of major surface 131 by etching in a known manner. The exposed portions of major surface 131 may form any number of patterns to be subsequently described, but for ease of illustration a ring-shaped pattern will now be described.

Figure 6:
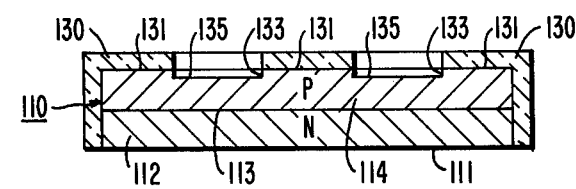

FIG. 6 illustrates the structure after the exposed portions of major surface 131 have been etched to produce recessed portions defined by side walls 133 and recessed surface 135. A preferred depth of recessed surface 135 is about 5 microns, but a range of depths from 1 to 20 microns will produce satisfactory results.

Figure 7:
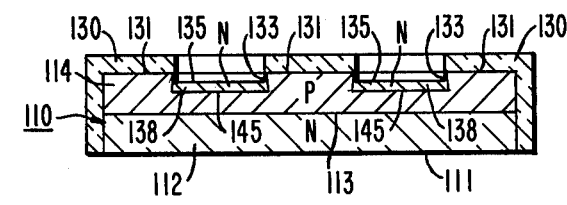

Next, an N-type diffusion is performed which produces an emitter zone 138 of N-type semiconductivity as shown in FIG. 7. A presently preferred dopant is phosphorus, for which gaseous diffusion methods are well known. N-type emitter zone 138 forms PN junction 145 with P-type base zone 114. In addition to formation of emitter zone 138, the N-type diffusion produces a high N-type concentration along surface 111. A doping profile of N+PN−N+ is thereby produced which, among other things, provides a transistor device with a current carrying capacity superior to that of prior art device 99, which has a profile of N+PN+.

The minimum thickness of the P-type base zone 114 is measured by the distance from PN junction 145 to PN junction 113, which is in the range of about 5 to 40 microns with about 15 microns being preferred. The thickness of base zone 114 and the relative concentrations in the base zone 114 and emitter zone 138, determine the gain of the device and therefore are of critical importance in transistor design.

One effect of providing a recessed surface for emitter zone 138 is that the high P-type surface concentration is reduced, thereby increasing injection efficiency and hence increasing gain. The following concentrations are given as illustrative of this aspect of the invention. Zone 138 has a preferred N-type concentration on the order of $1 \times 10^{20}$ atoms/cm$^3$ along surfaces 133 and 135. Zone 114 has a preferred P-type concentration on the order of $5 \times 10^{17}$ atoms/cm$^3$ along the major surface 131, the P-type concentration dropping off by about one order of magnitude at the depth of recessed surface 135. N-type zone 112 has an inner portion along PN junction 113 having a concentration equal to the background doping of the starting material, and zone 112 has an outer portion of a higher concentration which measures on the order of $1 \times 10^{20}$ atoms/cm$^3$ along surface 111. The concentration in P-type zone 114 drops off to a level equal to that of the inner portion of zone 112 at PN junction 113. The concentration along PN junction 145 is on the order of $8 \times 10^{15}$ atoms/cm$^3$. Presently preferred device characteristics may be achieved. however, with concentration ranges from about $3 \times 10^{15}$/cm$^3$ to about $3 \times 10^{16}$/cm$^3$ at PN junction 145.

Figure 8:
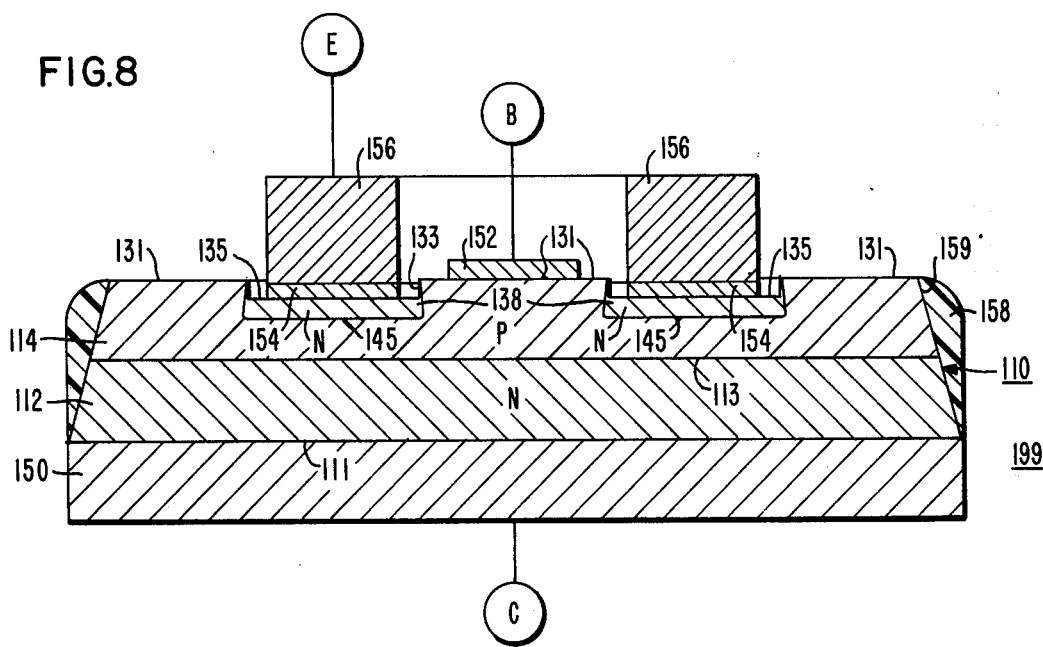
FIGS. 2-8 are vertical cross-sectional views of the device of the present invention at various stages in the manufacturing process.

FIGS. 8, 9, and 10 depict a transistor device 199 of the present invention at the final stage in the manufacturing process wherein the silicon dioxide has been stripped away from the wafer 110 and the edges 159 of the wafer have been beveled in a known manner. Preferably at this stage, the surface area of major surface 131 is about equal to that of recessed surface 135.

A supporting electrode 150 preferably of molybdenum is fused to flat circular-shaped major surface 111 of the wafer 110 in a known manner thereby making good electrical and thermal contact to the N-type collector zone 112. A circular shaped metal base electrode 152 and ring-shaped first emitter electrode 154 are preferably formed by depositing aluminum on the respective base and emitter surfaces 131 and 135 as shown in a known manner to make good electrical and thermal contact thereto. An insulating and protective coating 158 is applied to beveled edge 159 by any method known to those skilled in the art, a high temperature curing silicone varnish being a suitable coating material. A second emitter electrode 156 is held against first emitter electrode 154 (preferably by compression means not shown). Second emitter electrode 156 extends above major surface 131, the electrode 156 being preformed in the same pattern as first emitter electrode 154. A preferred material for second emitter electrode 156 is molybdenum.

Voltage breakdown of transistor devices occurs in two modes. There exists both a bulk breakdown mode and a surface breakdown mode. The bulk breakdown is related to the thickness of the base zone as measured from emitter-base junction to collector-base junction. The surface breakdown mode is related to the distance available for the charge to spread along the beveled edge surface of the semiconductor wafer.

Figure 1:
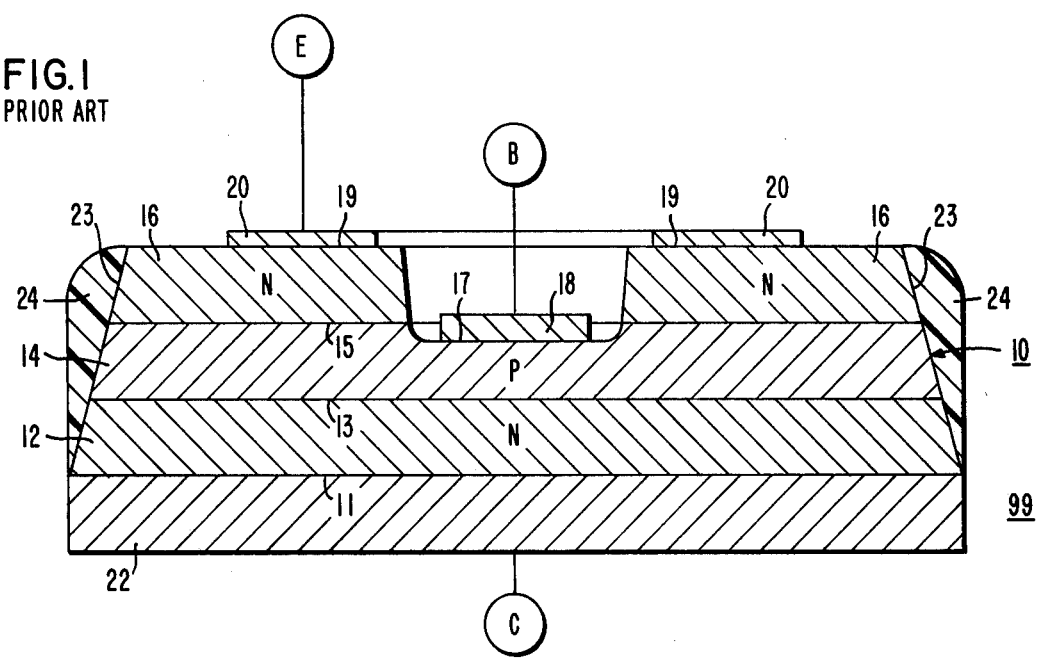
FIG. 1 is a vertical cross-sectional view of a device of the prior art.

It has been found that surface breakdown is the operative breakdown mode for prior art device 99 of FIG. 1. Therefore base zone 14 of prior art device 99 must be made thicker to achieve higher breakdown voltages. However, such an increase in thickness causes a corresponding decreases in transistor gain, which means that designers of prior art devices were forced to sacrifice gain to achieve a higher breakdown voltage.

Consequently, a inherent design weakness of prior art device 99 is a limitation of collector-base blocking voltage due to the presence of emitter-base junction 15 on beveled edge surface 23. When PN junction 13 is reverse biased, a phenomenon occurs wherein surface charge spreads from PN junction 13 to PN junction 15, which prevents further increase in reverse bias of PN junction 13. A transistor device of the present invention, such as device 199 of FIGS. 8, 9 and 10, overcomes the above-described inherent design weakness, since emitter-base junction 145 does not terminate on beveled edge surface 159. Therefore, the surface charge around collector-base junction 113 is allowed to spread fully along surface 159. The distance along beveled edge 159 may be increased to a point where the surface blocking capability equals the bulk blocking capability of the transistor device, which provides the optimum dimensions for maximining both gain and blocking voltage. For example, if emitter-base junction 145 were extended outwards to terminate at beveled edge surface 159 of device 199 in a manner similar to emitter-base junction 15 of prior art device 99, the collector-base blocking capability would be reduced by about 100 volts for a typical device designed to block about 600 volts.

Additionally, prior art device 99 suffers from a disadvantage not encountered by device 199; namely, that a relatively deep etch is required to penetrate the base zone 14 and provide surface 17 for contacting the base. An etch depth of more than about 50 microns is required since PN junction 15 typically lies at a depth of about 35 to 45 microns from major surface 19. On the other hand, as stated above, device 199 of the present invention has a recessed surface depth preferably of about 5 microns. Consequently, the degree of depth of surface 17 in prior art device 99 poses difficulties in forming a uniform base electrode 18 by photographic techniques, whereas a depth of about 5 microns poses little difficulty in forming a uniform emitter electrode 154 on device 199 of the present invention.

Figure 12:
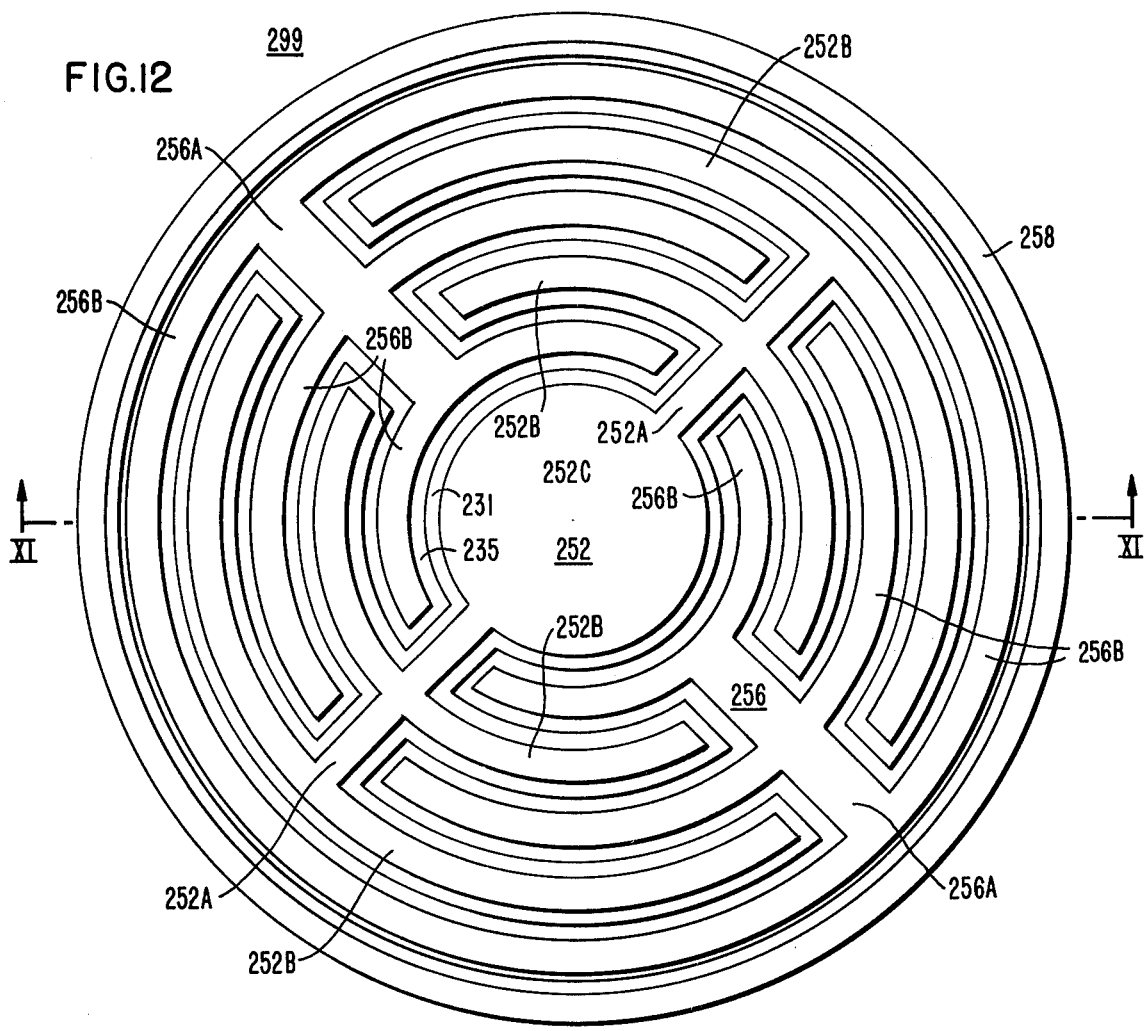
Figure 11:
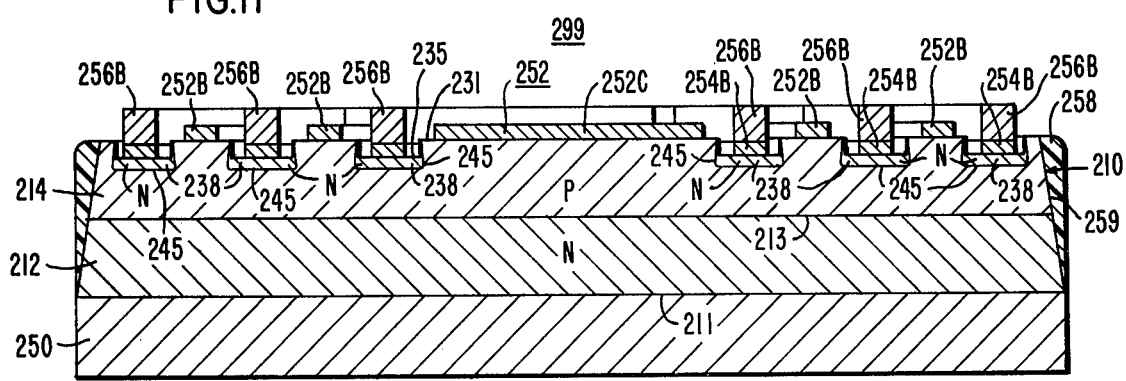
FIG. 11 is a cross-sectional view of a presently preferred embodiment of the present invention; and, FIG. 12 is a plan view of the embodiment of FIG. 11.

FIGS. 11 and 12 are views of a presently preferred embodiment 299 of the present invention, which is produced by like process steps and has a similar structure to embodiment 199. The only difference in structure between embodiments 299 and 199 is the emitter-base pattern and associated electrodes, like parts being designated by like numerals.

The transistor device embodiment 299 has an interdigitated emitter-base pattern, wherein base electrode 252 comprises a centrally located portion 252C, radial branches 252A and curved branches 252B, which are affixed to base zone 214. First and second emitter electrodes 254 and 256 are comprised of radial branches 254A and 256A, and curved branches 254B and 256B. The curved branches 254B and 256B are interdigitated with the curved branches 252B as shown. Emitter zone 238, which is in contact with electrode 254, forms a similar interdigitated pattern with adjacent portions of base zone 214. Second emitter electrode 256 is held against similarly shaped first emitter electrode 254 preferably by compression means not shown, which comprise a part of a compression bonded housing known in the art of power thyristors. It is presently preferred that second emitter electrode 256 is held in position during assembly of device 299 by adhesive means not shown, which secures the electrode 256 until the device 299 is encapsulated within a compression bonded housing. Emitter electrode 256 is preferably made of molybdenum and is sufficiently thick to extend past the top surface of the branches of base electrode 252, thereby permitting a ring-shaped contact (being part of a compression bonded housing not shown) to make external contact with the top surface of the emitter electrode 256. External contact is made to base electrode 252 at center portion 252C.

An advantage of transistor devices made in accordance with the present invention is that such transistor devices are wholly compatible with presently existing compression bonding encapsulation techniques commonly employed with power thyristor devices.

It will be apparent to those skilled in the art that the presently preferred embodiment of the present invention achieves a novel advance in the state of the art of transistor devices. It will be further apparent that a complementary device may be produced by interchanging the P and N regions of the above-described embodiments.

What is claimed is:

1. A transistor comprising a wafer of semiconductor material and contacting means for making thermal and electrical contact to said wafer;

said wafer comprising a collector zone of a first type of semiconductivity disposed along a first major surface of said wafer, a base zone of a second type of semiconductivity disposed adjacent to said collector zone, a collector-base PN junction formed between said collector zone and said base zone, an emitter zone of said first type of semiconductivity disposed adjacent to said base zone, an emitter-base PN junction formed between said emitter zone and said base zone, portions of said base zone extending past said emitter zone to a second major surface of said wafer, said second major surface being parallel to said first major surface, a beveled edge surface joins the periphery of said first and said second major surfaces, said beveled edge surface forming an acute angle with said first major surface and forming an obtuse angle with said second major surface, said beveled edge surface being separated from said emitter zone by portions of said base zone, said collector-base PN junction being parallel to said major surfaces and terminating at said beveled edge surface, a recessed surface bordering said emitter zone and parallel to said major surfaces, said recessed surface located at a predetermined depth from about 1 to 20 microns in said wafer from said second major surface;

said contacting means comprising a collector electrode affixed to said collector zone at said first major surface, a base electrode affixed to said base zone at said second major surface, a first emitter electrode affixed to said emitter zone at said recessed surface, and a second emitter electrode contacting said first emitter electrode and extending past said second major surface.

* * * * *